United States Patent
Shirley

(10) Patent No.: US 12,183,621 B2
(45) Date of Patent: Dec. 31, 2024

(54) METHODS FOR ADJUSTING SURFACE TOPOGRAPHY OF A SUBSTRATE SUPPORT APPARATUS

(71) Applicant: Micron Technology, Inc., Boise, ID (US)

(72) Inventor: Paul D. Shirley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 60 days.

(21) Appl. No.: 17/931,444

(22) Filed: Sep. 12, 2022

(65) Prior Publication Data
US 2023/0005785 A1    Jan. 5, 2023

Related U.S. Application Data

(62) Division of application No. 16/529,439, filed on Aug. 1, 2019, now Pat. No. 11,450,552.

(51) Int. Cl.
| | | |
|---|---|---|
| C23C 16/00 | (2006.01) | |
| C23F 1/00 | (2006.01) | |
| H01L 21/306 | (2006.01) | |
| H01L 21/66 | (2006.01) | |
| H01L 21/67 | (2006.01) | |
| H01L 21/687 | (2006.01) | |

(52) U.S. Cl.
CPC .. H01L 21/68764 (2013.01); H01L 21/67103 (2013.01); H01L 22/20 (2013.01)

(58) Field of Classification Search
CPC ........... H01L 21/68742; H01L 21/6875; H01L 22/12; H01L 21/67288
See application file for complete search history.

(56) References Cited

U.S. PATENT DOCUMENTS

| | | | |
|---|---|---|---|
| 5,932,009 A | 8/1999 | Kim et al. | |
| 9,281,252 B1* | 3/2016 | Würfel | ............... C23C 16/4586 |
| 9,853,209 B2 | 12/2017 | Fuji et al. | |
| 10,867,832 B2 | 12/2020 | Yu et al. | |
| 2005/0061995 A1 | 3/2005 | Vink et al. | |

(Continued)

FOREIGN PATENT DOCUMENTS

| | | |
|---|---|---|
| CN | 101645410 A | 2/2010 |
| CN | 102981370 A | 3/2013 |
| CN | 109427644 A | 3/2019 |

OTHER PUBLICATIONS

Chinese First Office Action for Chinese Application No. 202010743820. 5, dated Aug. 14, 2023, 17 pages with translation.

*Primary Examiner* — Anthony Ho
*Assistant Examiner* — David J Goodwin
(74) *Attorney, Agent, or Firm* — TraskBritt

(57) ABSTRACT

Systems, method and related apparatuses for adjusting support elements of a support apparatus to approximate a surface profile of a wafer. The support apparatus may include a group of mutually lateral adjacent support elements, each mutually lateral adjacent support element is configured to independently move at least vertically and comprising an upper surface. The support apparatus may further include a thermal energy transfer device operably coupled to each of the mutually lateral support elements, and an actuator system operably coupled to each of the support elements to selectively move one or more of the mutually lateral support elements vertically.

19 Claims, 11 Drawing Sheets

(56) References Cited

U.S. PATENT DOCUMENTS

| | | |
|---|---|---|
| 2006/0005770 A1 | 1/2006 | Tiner et al. |
| 2007/0049020 A1 | 3/2007 | Huang et al. |
| 2008/0011737 A1 | 1/2008 | Fukuoka et al. |
| 2009/0231561 A1 | 9/2009 | Arai |
| 2010/0032096 A1 | 2/2010 | Yu et al. |
| 2011/0111601 A1 | 5/2011 | Okita et al. |
| 2013/0230973 A1 | 9/2013 | Gauldin et al. |
| 2017/0022611 A9 | 1/2017 | Chang et al. |
| 2019/0096734 A1* | 3/2019 | Liao ..................... H01L 21/027 |
| 2019/0189593 A1 | 6/2019 | Kim et al. |
| 2021/0018676 A1 | 1/2021 | Sabert et al. |
| 2021/0066114 A1 | 3/2021 | Chen et al. |

* cited by examiner

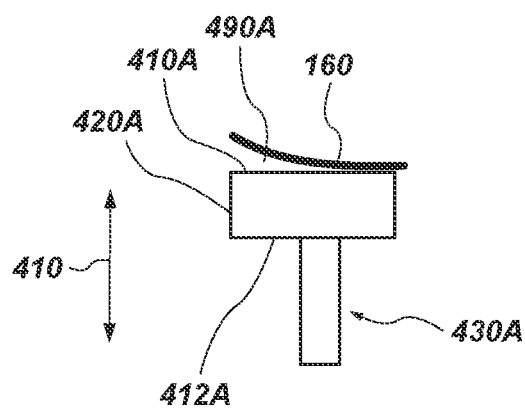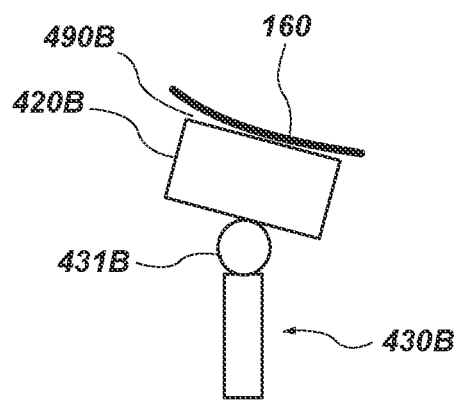
FIG. 4A  FIG. 4B
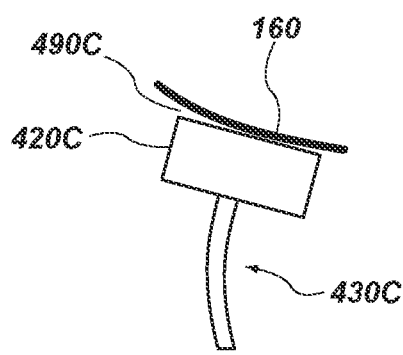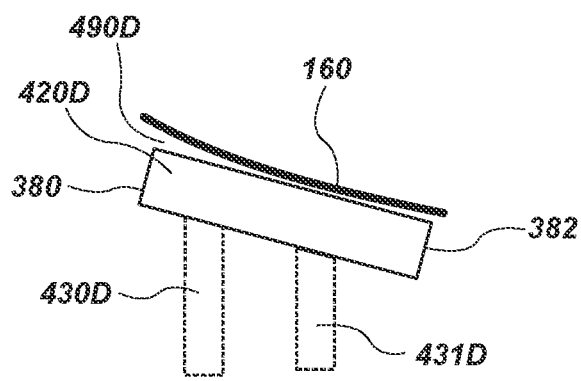
FIG. 4C  FIG. 4D

*700*

```
Receive a Surface Profile Data Map of a Bottom
Surface of a Semiconductor Wafer
710
```

↓

```
Based on the Surface Profile Data Map, Adjust an
Upper Surface of a Support Element to Cause the
Upper Surface to Approximate the Surface Profile of
the Bottom Surface of the Semiconductor Wafer
720
```

*FIG. 7*

METHODS FOR ADJUSTING SURFACE TOPOGRAPHY OF A SUBSTRATE SUPPORT APPARATUS

CROSS-REFERENCE TO RELATED APPLICATION

This application is a divisional of U.S. patent application Ser. No. 16/529,439, filed Aug. 1, 2019, now U.S. Pat. No. 11,450,552, issued Sep. 20, 2022, the disclosure of which is hereby incorporated herein in its entirety by this reference.

TECHNICAL FIELD

Embodiments of the disclosure relate to adjusting surface topography of an upper surface of a substrate support apparatus to match a non-linear surface of an object that is supported by the support apparatus, and more specifically, to adjusting the upper surface position of one or more support elements of a wafer support apparatus. More specifically, some embodiments relate to methods for adjusting one or more support elements to match a non-linear back side surface of a semiconductor wafer.

BACKGROUND

In the field of semiconductor wafer processing, it is common practice to subject the wafer to etching processes which selectively remove portions of material from a multi-layer device. Various types of etching processes and etching apparatus are used in the semiconductor wafer processing art to fabricate microelectronic integrated circuits. In the semiconductor wafer processing art, microelectronic devices are formed by depositing and etching integrated circuit components sequentially. Both wet and dry etching patterning processes are used where portions of a material are selectively removed as part of the process to fabricate features or components of microelectronic devices. In both wet and dry etch processes, it is desirable to selectively remove material uniformly and with precise alignment across the semiconductor wafer surface to maintain critical dimensions (CD) of the patterned structures and to avoid compromising subsequent processes, such as further photolithographic patterning processes. In some instances, microelectronic device structures are formed with CD's unacceptably outside of design specifications, leading to costly rejection of the process wafer.

The semiconductor wafer processing may include providing a photoresist film (e.g., resistive film) over a substrate such as a semiconductor wafer (that is initially flat) and subsequently baking (e.g., post-apply bake (PAB)) the substrate and photoresist film. The baking of the resistive film generates a stress on the wafer. This stress may cause a bowing (e.g., positive and/or negative bowing) or warping of the wafer.

One conventional solution in the etching process to account for a warped or bowed wafer is to secure the wafer to a hot plate during a baking process (e.g., post-apply bake) using a vacuum applied to the back side of the wafer through the hot plate. The force of the vacuum "sucks" or "pulls" the wafer (that includes the resistive film) into contact with the flat top surface of the hot plate such that the wafer is flat. However, this solution causes air flow as the vacuum is applied between the hot plate and wafer. The air flow may result in non-uniformity of temperature across the wafer and cause non-uniform baking/curing of the resistive film, which, in turn, may cause unacceptable CDs resulting from the subsequent etching process.

Moreover, various technologies, such as three-dimensional (3-D) tiered integrated circuits, use a thicker resistive film coating than other conventional technologies. As such, the bowing or warping of a wafer, for 3-D tiered integrated circuits, may be more severe than bowing or warping of wafers processed using other conventional technologies. Wafers with such a severe bow or warp may not be able to be sufficiently "pulled" into contact with a hot plate by a vacuum. Additionally, the increased vacuum force to pull a wafer with large bow to a hot plate increases the non-uniform baking/curing of the resistive film.

BRIEF DESCRIPTION OF THE SEVERAL VIEWS OF THE DRAWINGS

FIG. 4A is a side view of a support element and an associated actuator element, according to various embodiments of the present disclosure.

FIG. 4B is a side view of a support element and an associated actuator element, according to various embodiments of the present disclosure.

FIG. 4C is a side view of a support element and an associated actuator element, according to various embodiments of the present disclosure.

FIG. 4D is a side view of a support element and a plurality of associated actuator elements, according to various embodiments of the present disclosure.

FIG. 7 is a flowchart of an example method to translate one or more support elements in accordance with various embodiments of the present disclosure.

DETAILED DESCRIPTION

Figure 1A:
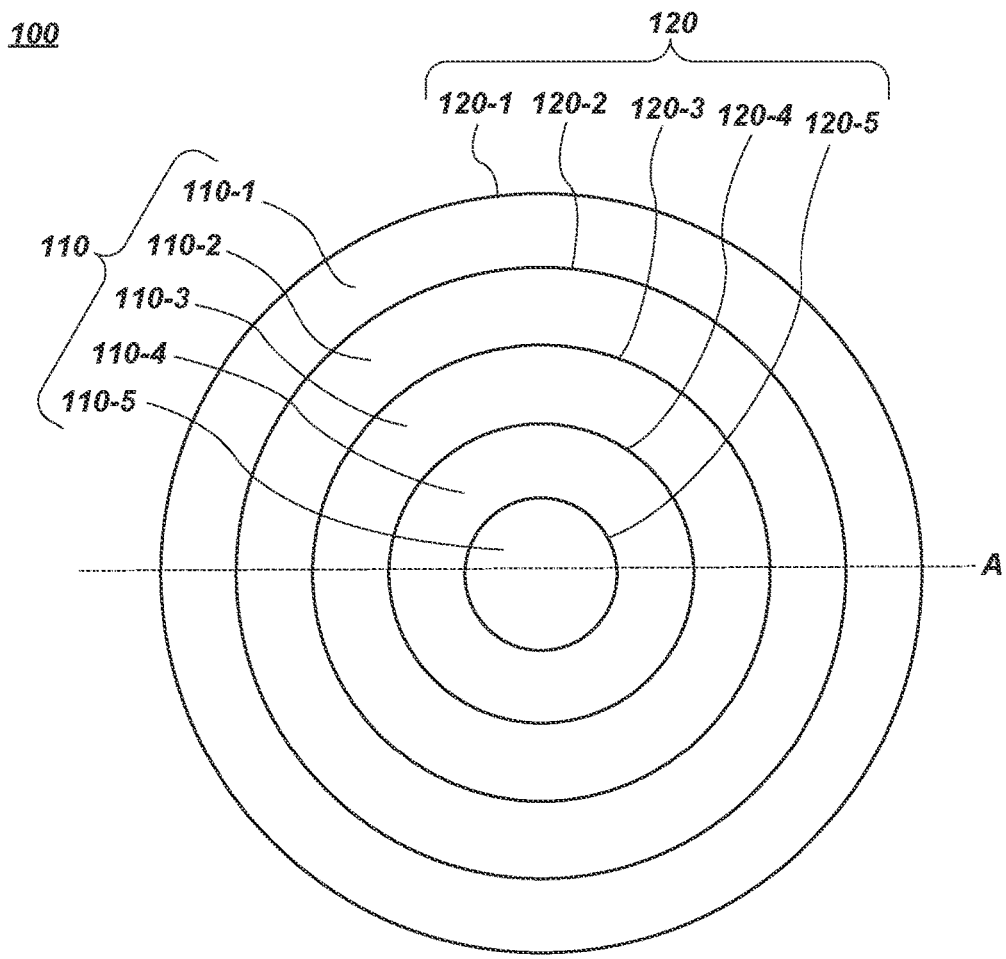
FIG. 1A is a top view of an apparatus that includes a group of mutually lateral adjacent support elements of a substrate support apparatus, in accordance with a number of embodiments of the present disclosure.

The fabrication of an integrated circuit (IC) often includes a variety of physical and chemical processes performed on a semiconductor (e.g., silicon) substrate, which may be configured as a wafer, or as another bulk substrate, such as a silicon-on-insulator (SOI) substrate or a silicon-on-glass (SOG) substrate. For convenience, all such substrates are referred to herein as "wafers." One such process is lithography (e.g., photolithography) which includes, among other things, applying a photoresist film over a substrate, such as a silicon wafer and subsequently baking the photoresist film. The baking of the photoresist film (e.g., post-apply bake, also termed a "soft" bake, to remove a solvent component of the photoresist and enhance adherence of the photoresist to the active surface) prior to patterning may cause the wafer to deform (e.g., bow or warp). A bowed or warped wafer may result in an inability to maintain critical dimensions (CD) of features during the fabrication of an integrated circuit. In various embodiments, lithography implemented in accordance with embodiments of the disclosure includes transferring thermal energy to (heating/baking) or from (cooling) a wafer. Typically, during the process of heating/cooling, a wafer is placed on a support apparatus, such as a cooling plate or hot plate.

Various embodiments described herein relate to, adjusting a top or upper surface of a support apparatus (e.g., hot plate or cooling plate) to match a non-linear back side surface of a wafer. In general, a non-linear back side surface of a wafer is at least one portion of the back side surface that is non-linear (or non-planar). Examples of a non-linear surfaces are, but not limited to, a bow and a warp. A bowed surface and/or a warped surface may be concave and/or convex. Additional description and examples of non-linear back side surfaces, such as a bow and a warp are provided in further detail herein.

In one embodiment, an apparatus (e.g., wafer support apparatus) includes a group of mutually lateral adjacent support elements. Each mutually lateral support element is configured to independently move at least vertically and comprising an upper surface. The support apparatus also includes a thermal energy transfer device operably coupled to each of the support elements, and an actuator system operably coupled to each of the mutually lateral support elements to selectively move one or more of the mutually lateral support elements vertically.

As will be described in further detail herein, by adjusting a top surface of a support apparatus to conform to a non-linear back side surface of a wafer (that is placed on the top surface of the support apparatus) a substantially uniform temperature may be applied to the wafer to facilitate uniform solvent removal and adherence to the active surface of the wafer. A uniform temperature applied to a nonlinear wafer surface facilitates in maintaining of critical dimensions (CD) of the patterned structures in the fabrication of ICs.

Figure 1B:
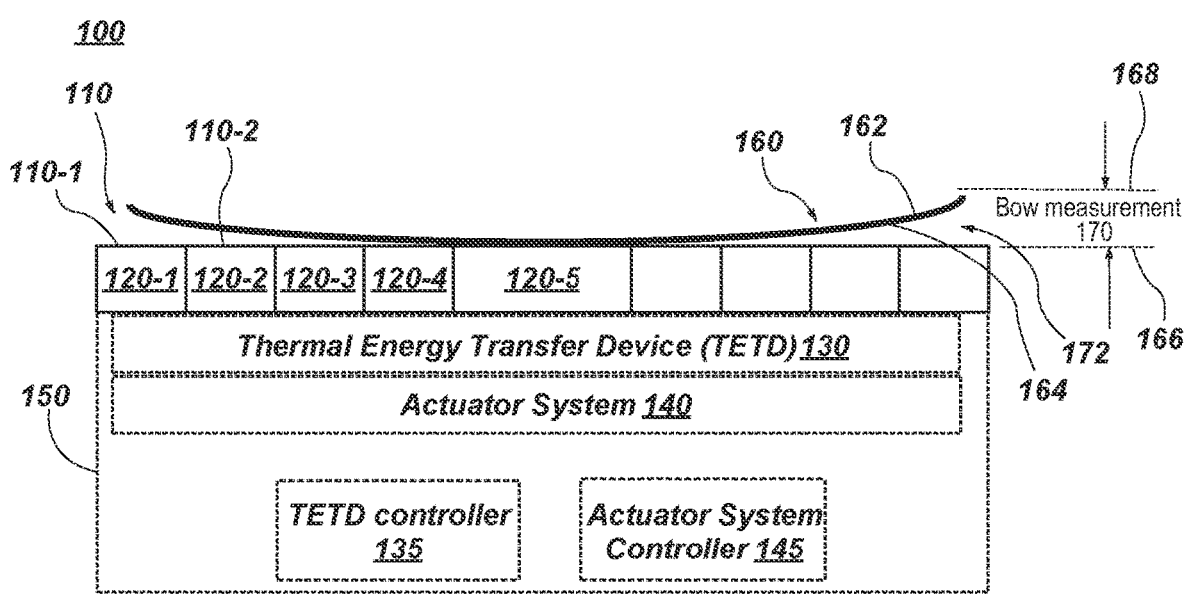
FIG. 1B illustrates a cross-sectional view of substrate support apparatus that includes a group of mutually lateral adjacent support elements, according to various embodiments of the present disclosure.

FIGS. 1A-1B depicts apparatus 100 (e.g., hot plate or cooling plate) for supporting wafer 160. FIG. 1A is a top view of apparatus 100. FIG. 1B is a cross-sectional view of apparatus 100 along plane A (in FIG. 1A). Apparatus 100 includes a group of support elements 120, such as support elements 120-1, 120-2 . . . 120-N, and a top surface 110. Apparatus 100 includes five separate mutually lateral adjacent support elements. However, the number of mutually lateral support elements may be more or less than five.

Top surface 110 is formed by the individual top surfaces of respective support elements, such as top surfaces 110-1, 110-2 . . . 110-N, which, in this embodiment, are substantially concentrically arranged. In one embodiment, top surface 110 includes top surfaces 110-1, 110-2, 110-3, 110-4 and 110-5. Support elements 120 (e.g., support elements 120-1, 120-2, 120-3, 120-4, and 120-5), in various embodiments, are a group of mutually lateral adjacent support elements. Each support element is configured to independently move at least vertically, which will be described in further detail below.

Apparatus 100 includes thermal energy transfer device (TETD) 130 that is controlled by TETD controller 135. TETD 130 is operably coupled to each of support elements 120 and is able to individually and selectively transfer thermal energy to and/or from wafer 160 at respective thermal energy transfer zones (TET zones) (e.g., heating zone and/or cooling zone). In one embodiment, each top surface of a respective support element corresponds to a thermal energy transfer zone. For example, apparatus 100 can include, for example five separate TET zones. In particular, a first TET zone corresponding to top surface 110-1 (of support element 120-1), a second TET zone corresponding to top surface 110-2 (of support element 120-2), a third TET zone corresponding to top surface 110-3 (of support element 120-3), and so on.

TETD 130 may comprise any thermal transfer device that is able to transfer thermal energy to (e.g., heat) or from (e.g., cool) wafer 160 at one or more TET zones. For example, TETD 130 may include, but is not limited to, a heating device (e.g., resistive heating element, fluid transfer system, etc.) and a cooling device (e.g., fluid transfer system, etc.). In one embodiment, TETD 130 is a thermoelectric device configured to selectively heat or cool using the Peltier effect.

Apparatus 100 includes actuator system 140 that is controlled by actuator system controller 145. Actuator system 140 is operably coupled to each of the support elements 120 to selectively move one or more of the support elements vertically. As a result, the combination of top surfaces 110 of each support element, as a whole, conforms to a non-linear surface of an object (e.g., wafer 160) placed on the support elements which will be described in further detail below.

Actuator system 140 may be any actuating device/system that facilitates in vertical translation of support elements 120. Actuator system 140 may include, but is not limited to, a piezoelectric actuator, an electrostatic actuator, a microelectromechanical systems (MEMS) actuator or a shape memory alloy actuator.

Apparatus 100 includes base 150. In various embodiments, support elements 120 are disposed at an upper portion of base 150. Additionally, various components such as TETD 130 actuator system 140, TETD controller 135 and actuator system controller 145 are disposed within base 150.

Referring to FIG. 1B, wafer 160 (e.g., a semiconductor wafer) includes top surface 162 and bottom surface 164. Bottom surface 164 of wafer 160 is placed on top surface 110 of apparatus 100. As depicted, wafer 160 is non-linear (e.g., non-planar). Wafer 160 may have various types of non-linear back side surface such a bow, a warp or a combination thereof. In one embodiment, a bow measurement is the deviation from a center point of the median surface. As depicted, wafer 160 has a bow measurement 170 measured from plane 166 corresponding to an apex of bottom surface 164 of wafer 160 and plane 168 corresponding to peripheral edges of non-linear wafer 160. Bow measurement 170, in one embodiment, is in the range of about +/−700 μm. In another embodiment, bow measurement 170 is in the range of about +/−1 mm. A bow may be a positive bow (see FIGS. 1B-1C) or a negative bow (see FIG. 1D). Wafer 160 may include various types of non-linear back side surfaces such as, but not limited to, a warp. In general, a warp measurement is the difference between the maximum and minimum distances of the median surface using the entire median surface rather than just the center point as with bow measurements. In various embodiments, warp measurements are determined by factors such as the wafer diameter, the wafer thickness, gravity, and how the wafer is held. A warped wafer may exhibit curvatures in multiple directions with respect to a major plane of the wafer, and also different curvatures in different directions along the plane of a wafer. For example, a warped wafer may exhibit a shallow twisted configuration, or a rippled configuration. Other types of non-linear back side surface of a wafer can be expected. For example, a non-linear back side surface of a wafer may be a paraboloid, such as a hyperbolic paraboloid.

Due to the non-linear back side surface of wafer 160, gap 172 is formed between top surface 110 and bottom surface 164. Gap 172 prevents uniform energy transfer to/from wafer 160 via TETD 130. As described above, in conventional technologies, critical dimensions (CD) are not able to be maintained throughout the active surface of the wafer 160 due to the presence of gap 172.

Figure 1C:
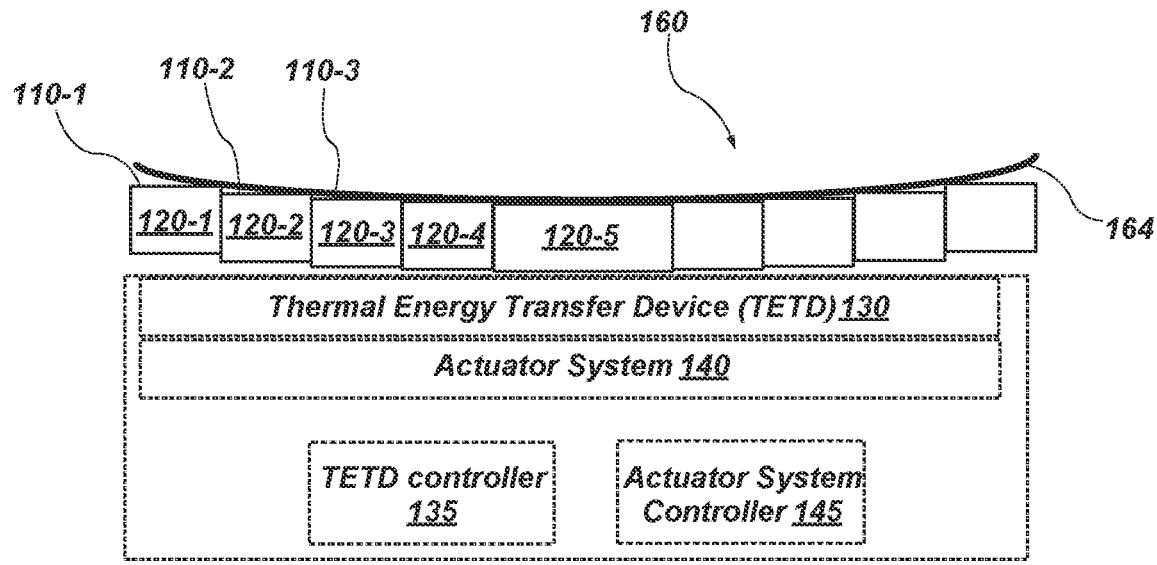
FIG. 1C illustrates a cross-sectional view of a substrate support apparatus that includes a group of mutually lateral adjacent support elements that are vertically translated, according to various embodiments of the present disclosure.

FIG. 1C depicts support elements 120 of apparatus 100 vertically translating (selectively and independently) to approximate a surface profile (e.g., positive bow) of bottom surface 164. In one embodiment, actuator system 140 translates one or more support elements 120 vertically towards and in physical contact with bottom surface 164. For example, actuator system controller 145 provides control signals to actuator system 140 to cause at least support elements 120-1, 120-2, 120-3, and 120-4 to translate vertically towards (and in physical contact with) bottom surface 164 of wafer 160. In one embodiment, support element 120-5 is in contact with bottom surface 164 prior to translation of support elements 120. As such, support element 120-5 is not translated vertically.

The translation of support elements 120 causes top surfaces 110-1, 110-2, 110-3, and 110-4 to approximate the surface profile of the bottom surface 164. In other words, the translation of support elements 120 removes or diminishes gap 172 between top surface 110 and bottom surface 164 (as depicted in FIG. 1B).

As described above, each top surface of a respective support element corresponds to a TET zone. For example, apparatus 100 includes five separate TET zones corresponding to respective top surfaces of support elements 120.

Upon translation of support elements 120, TETD controller 135 causes TETD 130 to selectively transfer energy to/from wafer 160 at each respective TET zone. For example, TETD 130 heats/cools (1) a first TET zone (corresponding to top surface 110-1) to a first temperature, (2) a second TET zone (corresponding to top surface 110-2) to a second temperature and so on. This in turn, heats/cools wafer 160 (1) to the first temperature at a location corresponding to the first TET zone, and (2) to the second temperature, at a location corresponding to the second TET zone and so on. It should be appreciated that the temperatures at the different TET zones may be the same or different from one another.

Translating support elements 120 towards bottom surface 164 (to remove gap 172 and approximate the surface profile of the bottom surface 164) enables efficient energy transfer to/from wafer 160 via TETD 130. This results in, among other things, uniform energy transfer to/from wafer 160 which facilitates in maintaining of CDs of patterned structures.

Figure 1D:
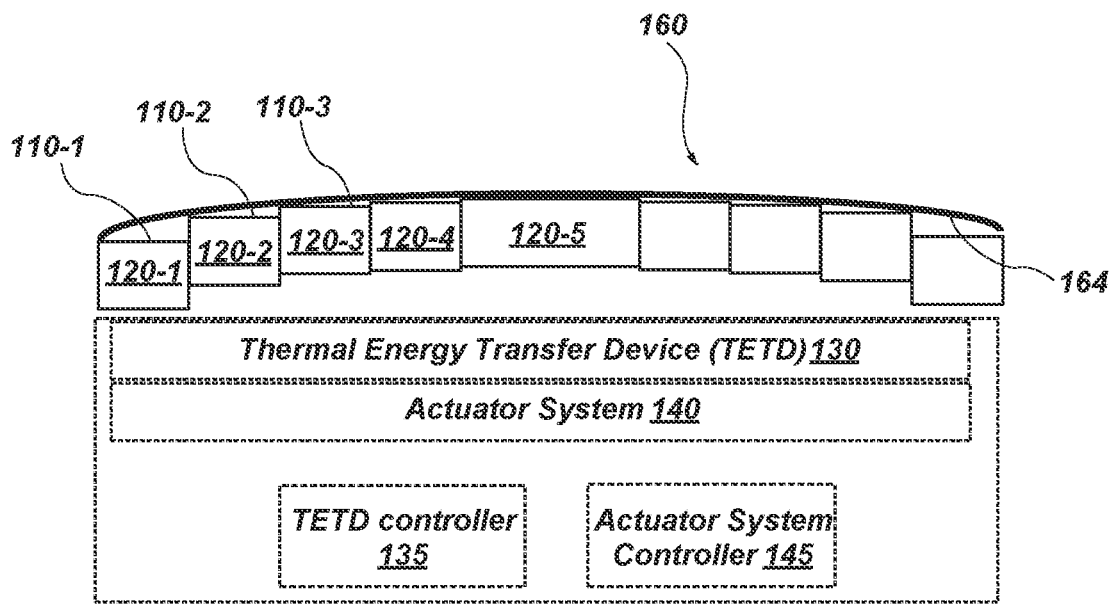
FIG. 1D illustrates a cross-sectional view of a substrate support apparatus that includes a group of mutually lateral adjacent support elements that are vertically translated, according to various embodiments of the present disclosure.

FIG. 1D depicts support elements 120 of apparatus 100 vertically translating (selectively and independently) support elements to approximate a surface profile (e.g., negative bow) of bottom surface 164. In one embodiment, actuator system 140 translates one or more support elements 120 vertically towards and in physical contact with bottom surface 164. For example, actuator system controller 145 provides control signal to actuator system 140 causing at least support elements 120-2, 120-3, 120-4, and 120-5 to translate vertically towards (and in physical contact with) bottom surface 164 of wafer 160. In one embodiment, support element 120-1 is in contact with bottom surface 164 prior to translation of support elements 120. As such, support element 120-1 is not translated vertically.

Upon translation of support elements 120, TETD controller 135 causes TETD 130 to selectively transfer energy to/from wafer 160 at each respective TET zone. This in turn, heats/cools wafer 160 to desired temperature(s) at locations corresponding to respective TET zones.

Figure 1E:
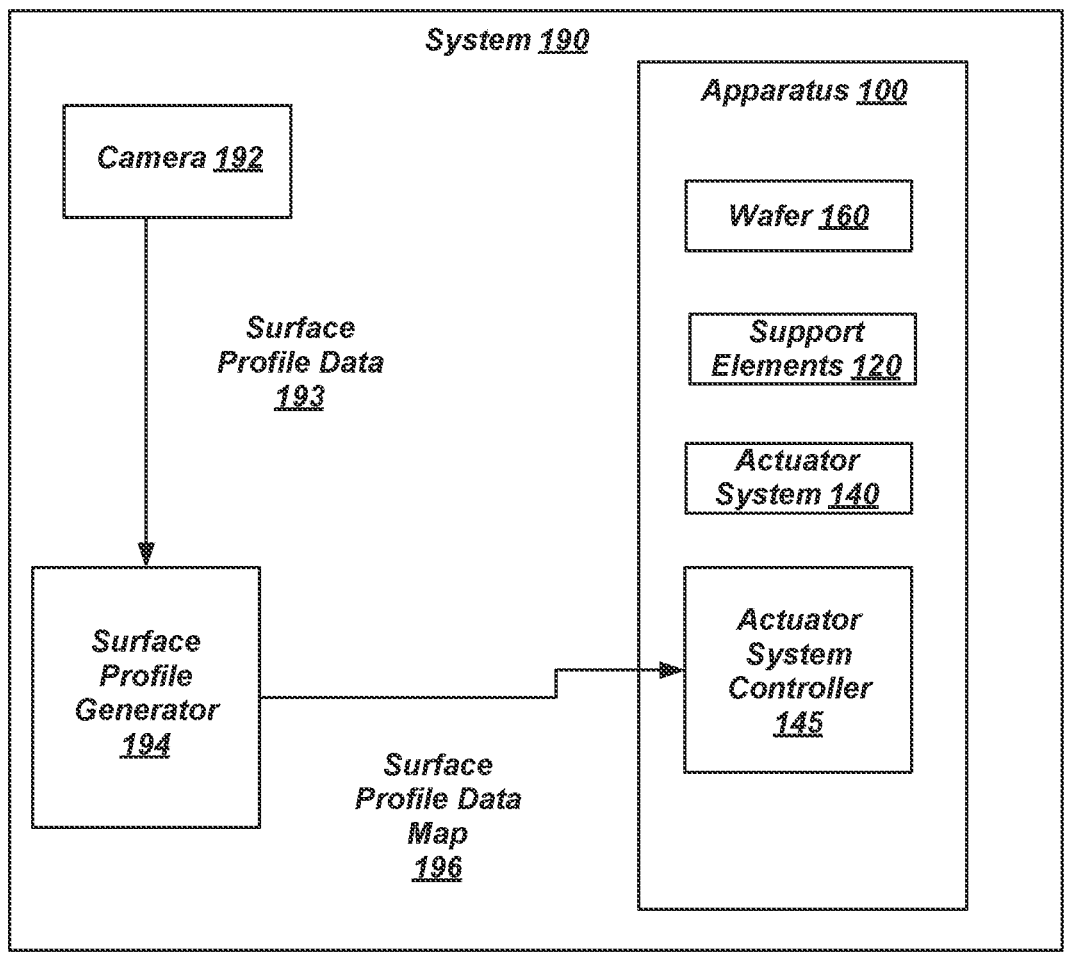
FIG. 1E illustrates a block diagram of a lithography system that includes a substrate support apparatus that includes a group of mutually lateral adjacent support elements that may be independently vertically translated, according to various embodiments of the present disclosure.

FIG. 1E depicts a system 190 for vertically translating one or more support elements 120 to approximate a surface profile of a wafer. System 190, in various embodiments, may be any system that facilitates in processing of a semiconductor wafer. For example, system 190 may comprise a photolithography coater and/or a photolithography developer.

System 190 includes camera 192, surface profile generator 194 and support apparatus 100.

Camera 192 is configured to take a photo of a wafer, such as wafer 160 with a non-linear back side surface. Camera 192 generates surface profile data 193 (e.g., image data) of wafer 160.

Surface profile generator 194 receives surface profile data 193. The surface profile data 193 represents a surface profile, in the X, Y and Z planes, of the back side of a wafer 160. Surface profile generator 194 generates a surface profile data map 196 based on surface profile data 193. Surface profile data map 196 can include, but is not limited to, bow measurement, warp measurement and the like. Surface profile data map 196 can include any surface mapping data such as two-dimensional (2-D) measurements and/or 3-D measurements.

Actuator system controller 145 receives surface profile data map 196. Upon receiving surface profile data map 196, actuator system controller 145 causes actuator system 140 to translate one or more of support elements 120. This causes respective top surfaces of support elements 120 to approximate the surface profile of the back side surface of wafer 160 and maintain contact of the respective top surfaces with the back side surface of wafer 160.

Figure 2A:
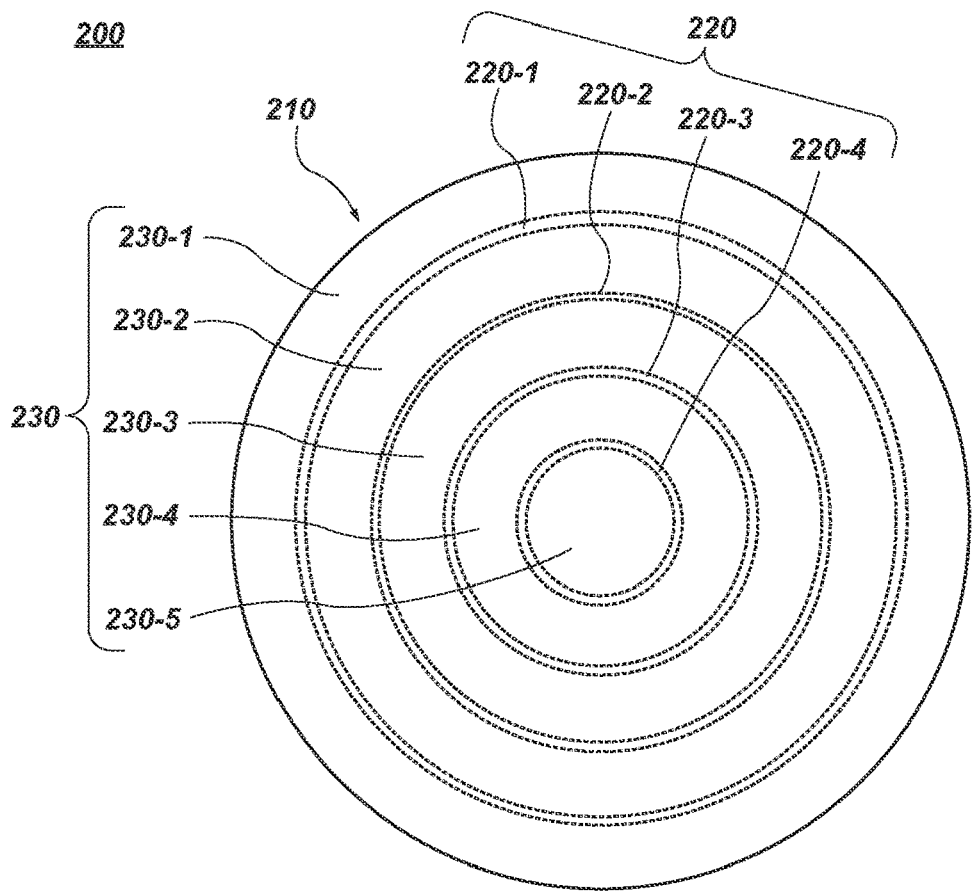
FIG. 2A is a top view of a substrate support apparatus that includes a continuous flexible layer over a group of mutually lateral adjacent support elements, according to various embodiments of the present disclosure.
Figure 2B:
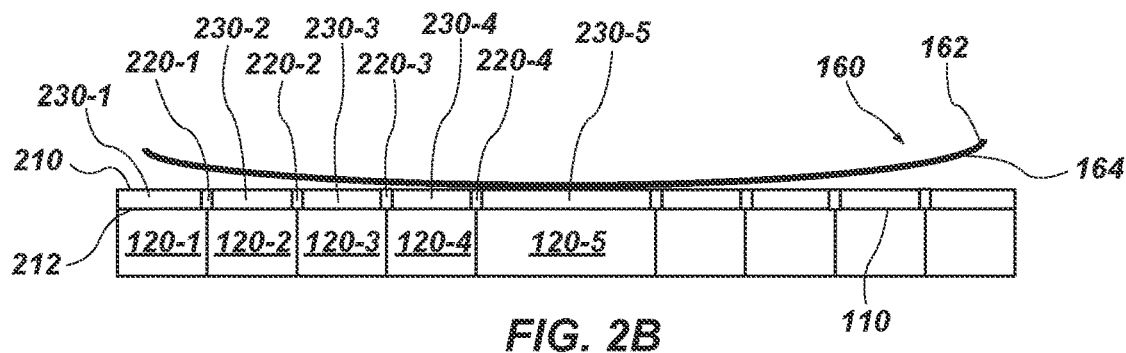
FIG. 2B is a cross-sectional view of a substrate support apparatus that includes a continuous flexible layer over a group of mutually lateral adjacent support elements, according to various embodiments of the present disclosure.
Figure 2C:
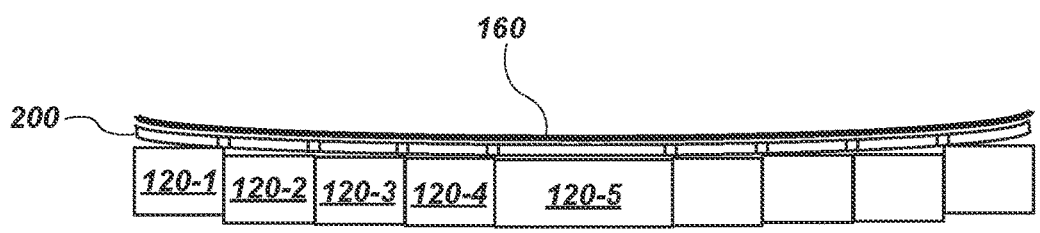
FIG. 2C is a cross-sectional view of a substrate support apparatus that includes a continuous flexible layer, in a flexed state, over a group of mutually lateral adjacent support elements, according to various embodiments of the present disclosure.

FIGS. 2A-2C depicts a continuous flexible layer 200 of a support apparatus according to various embodiments. In particular, FIG. 2A depicts a top view of continuous flexible layer 200. FIG. 2B depicts a cross-sectional view of continuous flexible layer 200 over support elements 120 prior to translation of support elements 120. FIG. 2C depicts a cross-sectional view of continuous flexible layer 200 over support elements subsequent to translation of support elements 120. For the sake of clarity and brevity, FIGS. 2A-2C depict support elements 120 of apparatus 100, continuous flexible layer 200 and wafer 160.

Referring to FIGS. 2A-2B, continuous flexible layer 200 is disposed over support elements 120. In particular, continuous flexible layer 200 includes top surface 210 configured to receive a bottom surface 164 of wafer 160 and bottom surface 212 that is adjacent top surfaces 110 of support elements 120.

Continuous flexible layer 200 may be comprised of any flexible material (e.g., polymer material) that is conducive to flexing caused by translation of support elements 120. Additionally, continuous flexible layer 200 may include one or more materials that facilitate in the transfer of thermal energy between TETD 130 and wafer 160. For example, nanofiber-based polyethylene films have been developed which, for example, are two orders of magnitude more thermally conductive than most polymers, as well as steel and ceramics.

Continuous flexible layer 200 includes thermal insulating material 220 disposed laterally between material 230 (e.g., heat transfer material) at the upper end of each support element. Material 230 is disposed over respective top surfaces of support elements 120. As described above, each top surface of a respective support element corresponds to a TET zone. For example, apparatus 100 can include five separate TET zones corresponding to respective top surfaces of support elements 120. Accordingly, material 230 corresponds to each respective TET zone. For example, material 230-1 is disposed over a first TET zone corresponding to top surface 110-1 (of support element 120-1), material 230-2 is disposed over a second TET zone corresponding to top surface 110-2 (of support element 120-2), material 230-3 is disposed over a third TET zone corresponding to top surface 110-3 (of support element 120-3), material 230-4 is disposed over a fourth TET zone corresponding to top surface 110-4 (of support element 120-4), and material 230-5 is disposed over a fifth TET zone corresponding to top surface 110-5 (of support element 120-5).

Thermal insulating material 220 is disposed over adjacent edges of support elements 120. For example, thermal insulating material 220-1 is disposed over adjacent lateral side surfaces of support elements 120-1 and 120-2, thermal insulating material 220-2 is disposed over adjacent lateral side surfaces of support elements 120-2 and 120-3, thermal insulating material 220-3 is disposed over adjacent lateral side surfaces of support elements 120-3 and 120-4, and thermal insulating material 220-4 is disposed over adjacent lateral side surfaces of support elements 120-4 and 120-5.

Thermal insulating material 220 is configured to provide thermal insulation between laterally adjacent segments of material 230. For example, thermal insulating material 220-1 thermally insulates material 230-1 and 230-2, thermal insulating material 220-2 thermally insulates material 230-2 and 230-3 and so on. As such, thermal insulating material 220 is configured to provide thermal insulation between TET zones. For example, thermal insulating material 220-1 thermally insulates a first TET zone corresponding to top surface 110-1 (of support element 120-1) and a second TET zone corresponding to top surface 110-2 (of support element 120-2), thermal insulating material 220-2 thermally insulates a second TET zone corresponding to top surface 110-2 (of support element 120-2) and a third TET zone corresponding to top surface 110-3 (of support element 120-3) and so on.

Referring to FIG. 2C, support elements 120 are vertically translated towards bottom surface 164 of wafer 160, as described above with respect to at least FIG. 1C. In particular, support elements 120 of apparatus 100 are vertically translating (selectively and independently) to approximate a surface profile (e.g., negative bow) of bottom surface 164. As a result, continuous flexible layer 200 flexes causing top surface 210 to approximate a surface profile of bottom surface 164.

Upon translation of support elements 120, TETD controller 135 causes TETD 130 to selectively transfer energy to/from wafer 160 at each respective TET zone. Specifically, TETD 130 selectively transfers energy to/from wafer 160 at each TET zone via respective material 230 of continuous flexible layer 200. This in turn, heats/cools wafer 160 to desired temperature(s) at locations corresponding to respective TET zones.

Figure 3A:
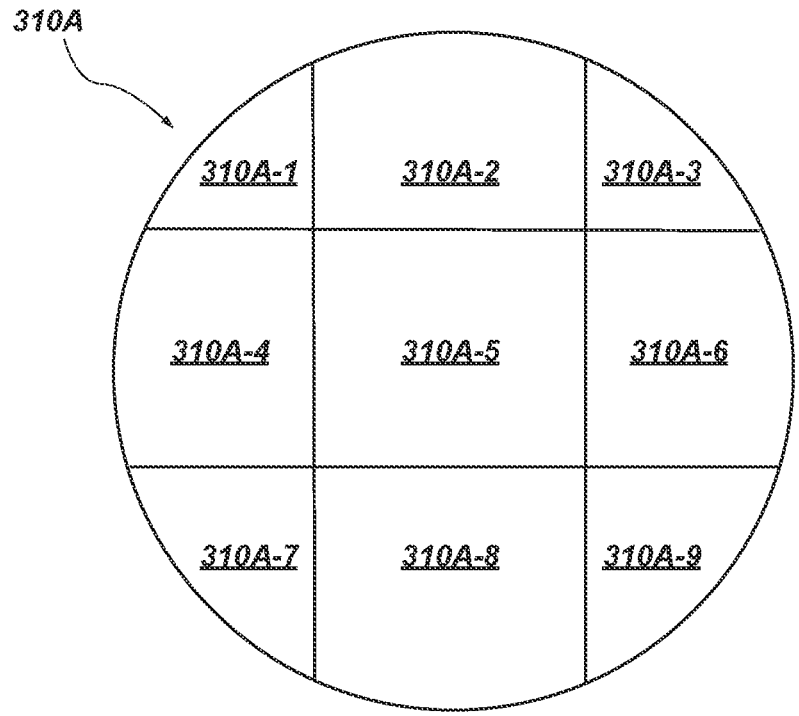
FIG. 3A is a top view of a substrate support apparatus that includes a group of mutually lateral adjacent support elements arranged in an array of rows and columns, in accordance with a number of embodiments of the present disclosure.
Figure 3B:
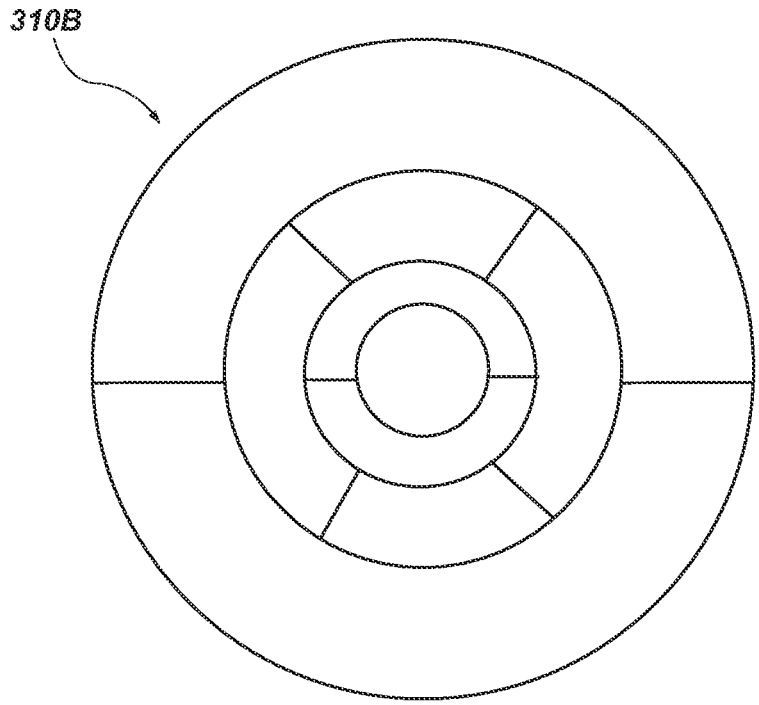
FIG. 3B is a top view of a substrate support apparatus that includes a group of mutually lateral adjacent support elements having various shapes and arranged substantially concentrically, according to various embodiments of the present disclosure.
Figure 3C:
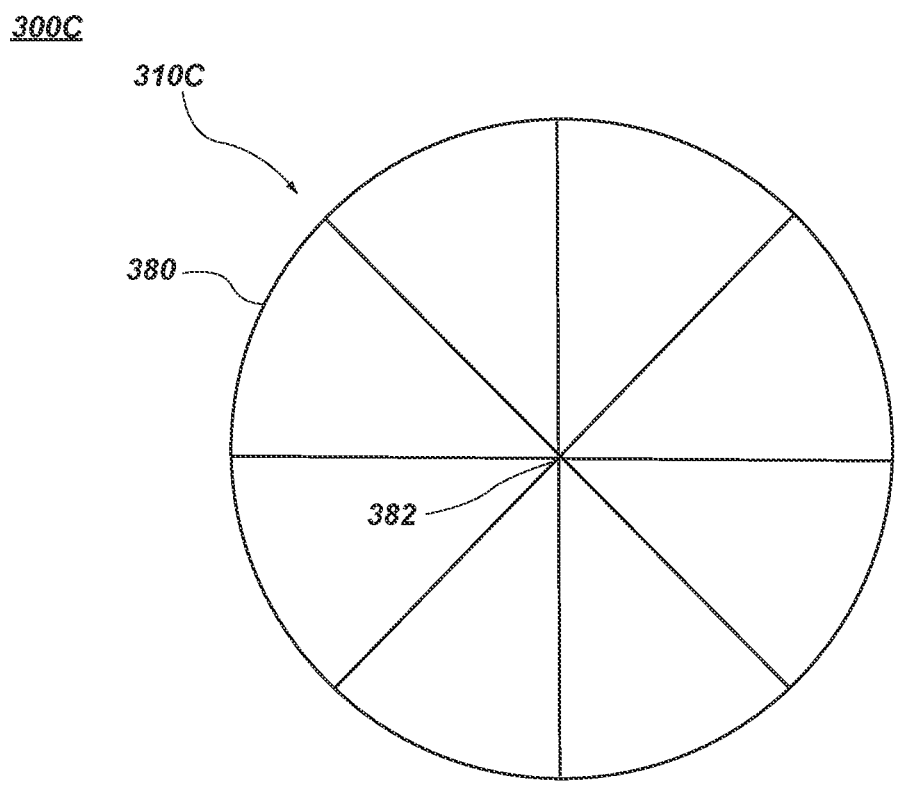
FIG. 3C is a top view of a substrate support apparatus that includes a group of mutually lateral adjacent support elements each having a pie-slice shape, according to various embodiments of the present disclosure.

FIGS. 3A-3C depict various embodiments of support elements of respective support apparatuses. FIG. 3A depicts a top view of a group of mutually lateral adjacent support elements 300A. In particular, FIG. 3A depicts a top view of nine separate mutually lateral adjacent support elements. However, the number of mutually lateral support elements may be more or less than nine and is not limited to a specific number. Each support element is configured to independently move at least vertically. Support elements 300A are configured in an array of rows and columns. The combination of support elements 300A includes top surface 310A. Each support element includes a top surface (e.g., 310A-1 through 310A-9).

As described above, each top surface of a respective support element corresponds to a thermal energy transfer zone. For example, a first TET zone corresponds to top surface 310A-1 (of a first support element), a second TET zone corresponds to top surface 310A-2 (of a second support element), a third TET zone corresponding to top surface 310A-3 (of a third support element), and so on.

FIG. 3B depicts a top view of a group of mutually lateral adjacent support elements 300B. In particular, FIG. 3B depicts a top view of nine separate mutually lateral adjacent support elements. However, the number of mutually lateral support elements may be more or less than nine and is not limited to a specific number. Each support element is configured to independently move at least vertically. Support elements 300B are configured in various configurations (e.g., circle, semi-circle, etc.). The combination of support elements 300B forms top surface 310B. As described above, each top surface of a respective support element corresponds to a thermal energy transfer zone. For example, a first TET zone corresponds to a first top surface (of a first support element), a second TET zone corresponds to second top surface (of a second support element), a third TET zone corresponding to a third top surface (of a third support element), and so on.

FIG. 3C depicts a top view of a group of mutually lateral adjacent support elements 300C. In particular, FIG. 3C depicts a top view of eight separate mutually lateral adjacent support elements. However, the number of mutually lateral adjacent support elements may be more or less than eight and is not limited to a specific number. Support elements 300B are pie-slice shaped. Each support element is configured to independently move at least vertically. In one embodiment, a first edge (e.g., edge 380) of a support element vertically translates a first distance and a second opposite edge (e.g., edge 382) vertically translate a second distance (less than the first distance). As such, the support elements are able to "tilt" with respect to a center point of support elements 300C.

The combination of support elements 300C comprises top surface 310C of a support apparatus. Each support element includes a top surface. As described above, each top surface of a respective support element corresponds to a thermal energy transfer zone. For example, a first TET zone corresponds to a first top surface (of a first support element), a second TET zone corresponds to second top surface (of a second support element), a third TET zone corresponding to a third top surface (of a third support element), and so on.

Figure 3D:
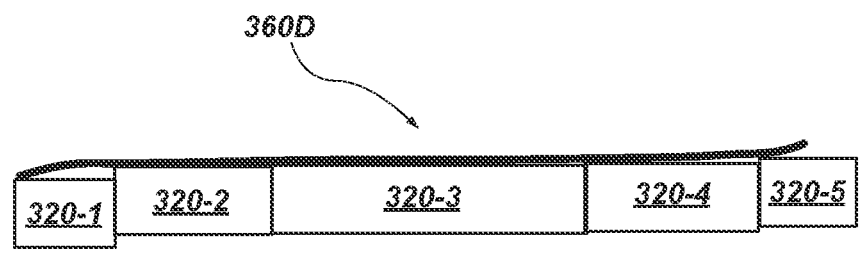
FIG. 3D illustrates a cross-sectional view of a group of mutually lateral adjacent support elements of a substrate support apparatus receiving a wafer with a 3-D non-linear back side surface, according to various embodiments of the present disclosure.

FIG. 3D depicts a cross-sectional view of a group of mutually lateral adjacent support elements 300D. For example, support elements 320-1, 320-2, 320-3, 320-4 and 320-5. It should be appreciated that support elements 300D may include more or less than support elements 320-1, 320-2, 320-3, 320-4, and 320-5 and is not limited to a specific number of support elements. Support elements 300D are configured to receive wafer 360D that includes a 3-D non-linear back side surface (e.g., a positive bow and negative bow). Moreover, support elements 300D are configured to translate vertically (e.g., up and/or down) to approximate a surface profile (e.g., positive bow and a negative bow) of wafer 360D.

FIGS. 4A-4D depict a side view of embodiments of at least a portion of an actuator system operably coupled to a bottom surface of a support element. FIG. 4A depicts support element 420A. Support element 420A may be a support element (e.g., support element 120-1) in a group of mutually lateral adjacent support elements (e.g., support elements 120). Support element 420A includes top surface 410A and bottom surface 412A. Actuator element 430A (e.g., a post) is coupled to bottom surface 412A. Actuator element 430A is coupled to an actuator system (e.g., actuator system 140). The actuator system translates actuator element 430A and support element 420A in a vertical direction 410 towards and in contact with bottom surface of wafer 160. In one embodiment, a gap 490A may still remain between a back side of wafer 160 and a top surface 410A of support element 420A. Optionally, actuator element 430A may be flexibly coupled to the bottom surface 412A of support element 420A with a polymer, other elastomer or other resilient member.

FIG. 4B depicts support element 420B. Support element 420B may be a support element (e.g., support element 120-1) in a group of mutually lateral adjacent support elements (e.g., support elements 120). Actuator element 430B is coupled to a bottom surface of support element 420B. Actuator element 430B is coupled to an actuator system (e.g., actuator system 140). The actuator system translates the actuator element 430B and support element 420B in a vertical direction towards and in contact with bottom surface of wafer 160. Actuator element 430B includes a ball joint 431B. Ball joint 431B enables actuator element 430B to pivot when it comes in contact with a bottom surface of wafer 160. As a result, a gap 490B between a top surface of support element 420B and a bottom surface of wafer 160 is minimized (for example, as compared to gap 490A).

FIG. 4C depicts support element 420C. Support element 420C may be a support element (e.g., support element 120-1) in a group of mutually lateral adjacent support elements (e.g., support elements 120). Actuator element 430C is coupled to a bottom surface of support element 420C. Actuator element 430C is coupled to an actuator system (e.g., actuator system 140). The actuator system translates the actuator element 430C and support element 420C in a vertical direction towards and in contact with bottom surface of wafer 160. Actuator element 430C includes a flexible post. The flexible post flexes when actuator element 430C comes in contact with a bottom surface of wafer 160. This causes a top surface of actuator element 430C to turn towards the bottom surface of wafer 160. As a result, a gap 490C between a top surface of support element 420C and a bottom surface of wafer 160 is minimized (for example, as compared to gap 490A).

FIG. 4D depicts support element 420D. Support element 420D may be a support element (e.g., support element 120-1) in a group of mutually lateral adjacent support elements (e.g., support elements 120). A plurality of actuator elements (e.g., element 430D and element 431D) are coupled to a bottom surface of support element 420D. The actuator elements are coupled to an actuator system (e.g., actuator system 140). The actuator system translates the actuator elements and support element 420C in a vertical direction towards and in contact with bottom surface of wafer 160. In one embodiment, actuator element 420D is one of the pie-shaped actuator elements in group of support elements 300C (see FIG. 3C). As such, a first edge (e.g., edge 380) of actuator element 430D vertically translates a first distance and a second opposite edge (e.g., edge 382) vertically translate a second distance (less than the first distance). This causes support elements 420D to "tilt" with respect to a center point of support elements 300C. Additionally, a gap 490D between a top surface of support element 420D and a bottom surface of wafer 160 is minimized (for example, as compared to gap 490A).

Figure 5A:
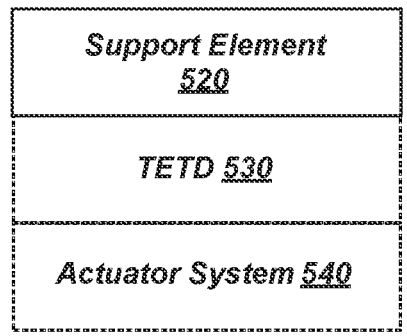
FIG. 5A is a block diagram of a side view of a support element, a thermal energy transfer device (TETD) and an actuator system, according to various embodiments of the present disclosure.
Figure 5B:
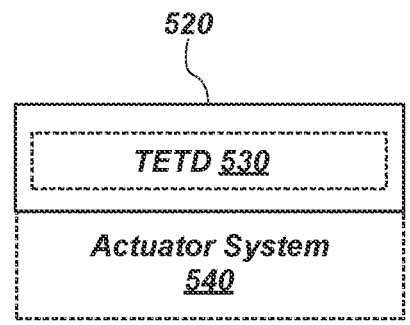
FIG. 5B is a block diagram of a side view of a support element, a thermal energy transfer device (TETD) and an actuator system, according to various embodiments of the present disclosure.
Figure 5C:
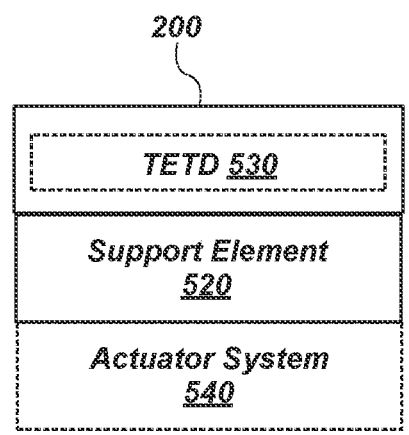
FIG. 5C is a block diagram of a side view of a support element, a thermal energy transfer device (TETD), an actuator system and a continuous flexible layer, according to various embodiments of the present disclosure.

FIGS. 5A-5C depict block diagrams of physical relationships between support elements, TETDs, and actuator systems. FIG. 5A depicts support element 520. Support element 520 may be a support element (e.g., support element 120-1) in a group of mutually lateral adjacent support elements (e.g., support elements 120). TETD 530 and actuator system 540 are operably coupled to a bottom surface of support element 520. For example, TETD 530 may be directly coupled to support element 520 and actuator system 540 is coupled to TETD 530.

FIG. 5B depicts TETD 530 disposed in support element 520. Actuator system 540 is operably coupled to a bottom surface of support element 520. As such, actuator system 540 is able to vertically translate support element 520 (and TETD 530 that is embedded in support element 520). TETD 530 may be partially embedded or completely embedded within support element 520.

FIG. 5C depicts TETD 530 disposed within layer 200. TETD 530 may be partially embedded or completely embedded within layer 200. Actuator system 540 is operably coupled to a bottom surface of support element 520. As such, actuator system 540 is able to vertically translate support element 520 (and TETD 530 that is embedded in layer 200).

Figure 6A:
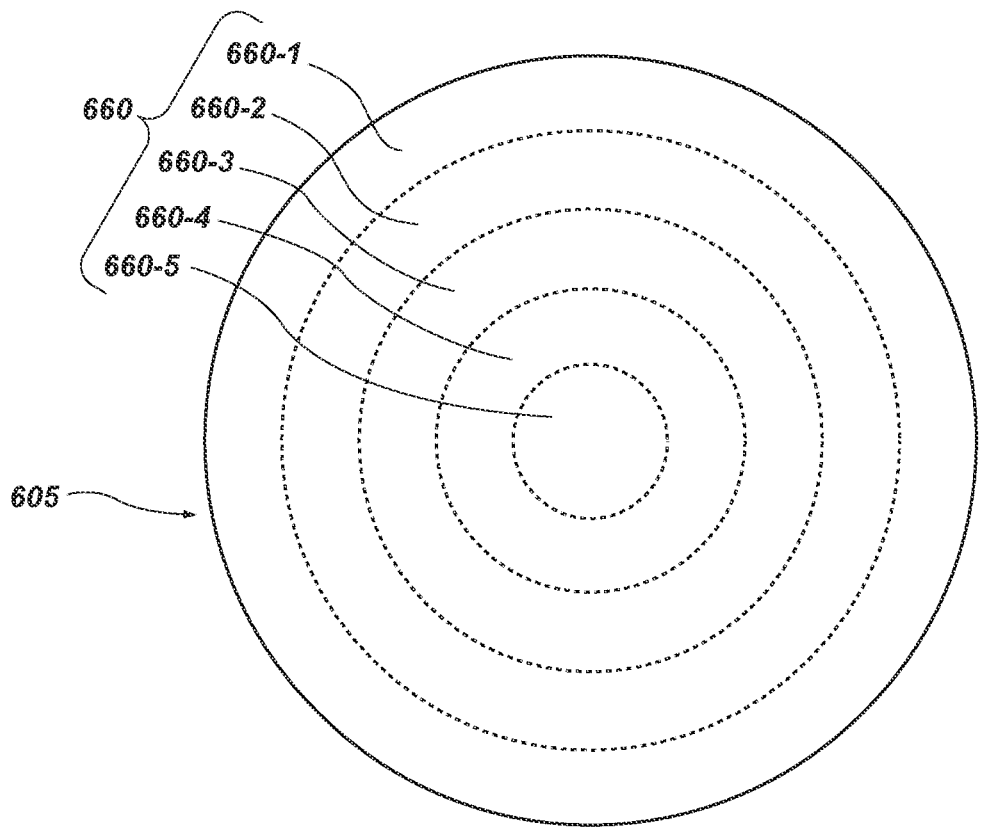
FIG. 6A is a top view of a substrate support apparatus that includes a continuous flexible support layer, according to various embodiments of the present disclosure.
Figure 6B:
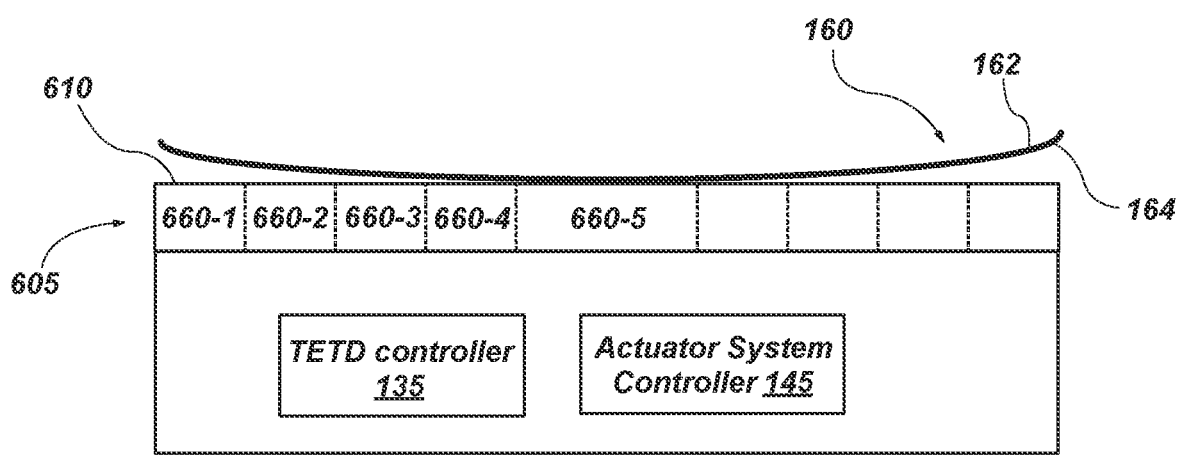
FIG. 6B is a cross-sectional view of an apparatus that includes a continuous flexible support layer, according to various embodiments of the present disclosure.

FIGS. 6A-6B depicts an embodiment of continuous flexible support layer 605 of wafer support apparatus 600. FIG. 6A depicts a top view of continuous flexible support layer 605. FIG. 6B depicts a cross-sectional view of continuous flexible support layer 605. Continuous flexible support layer 605 includes top surface 610 configured to receive a bottom surface of wafer 160. Support layer 605 includes a plurality of adjacent TET zones 660 (e.g., TET zones 660-1, 660-2, 660-3, 660-4, and 660-5).

Figure 6C:
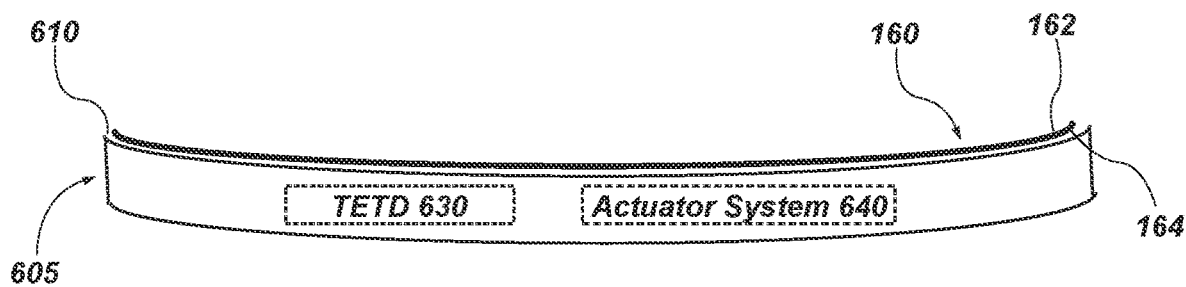
FIG. 6C is a cross-sectional view of an apparatus that includes a continuous flexible support layer, in a flexed state, according to various embodiments of the present disclosure.

FIG. 6C depicts an embodiment of continuous flexible support layer 605 in a flexed position. Continuous flexible support layer 605 includes TETD 630 and actuator system 640. TETD 630 and actuator system 640 may be partially or completely disposed in support layer 605. Actuator system 640 is operably coupled (e.g., embedded) to continuous flexible support layer 605 and configured to flex an upper surface of support layer 605 to conform to a bottom surface of the wafer 160. In one embodiment, actuator system 640 is a shape memory alloy actuator. A shape memory alloy is an alloy that can be deformed at a first temperature and returns to its pre-deformed ("remembered") shape when at a second temperature. TETD 630 is operably coupled (e.g., embedded in) to support layer 605 and configured to independently transfer thermal energy to or from each of TET zones 660.

FIG. 7 is a flowchart of a method 700 to translate one or more support elements to approximate the surface profile of the bottom surface of the semiconductor wafer, in accordance with various embodiments of the disclosure. Method 700 may be arranged in accordance with at least one embodiment described in the present disclosure. Method 700 may be performed, in some embodiments, by a device or system, such as apparatus 100 of FIGS. 1A-1D, support elements in FIGS. 2A-5C, and/or apparatus 600 of FIGS. 6A-6B, or another apparatus or system. Although illustrated as discrete blocks, various blocks may be divided into additional blocks, combined into fewer blocks, or eliminated, depending on the desired implementation.

At block 710 of method 700, a surface profile data map of a bottom surface of a semiconductor wafer is received. For example, actuator system controller 145 receives surface profile data map 196 (generated by surface profile generator 194).

At block 720, based at least in part on the surface profile data map, levels of upper surfaces of a group of support elements are adjusted to cause the upper surfaces to approximate the surface profile of the bottom surface of the semiconductor wafer. For example, upon the receipt of surface profile data map 196, actuator system controller 145 causes actuator system 140 to translate one or more of support elements 120 independently and vertically. This causes respective top surfaces of support elements 120 to approximate the surface profile of the back side surface of wafer 160 and maintain contact of the respective top surfaces with the back side surface of wafer 160.

One or more embodiments of the present disclosure include an apparatus that includes a group of mutually lateral adjacent support elements. Each mutually lateral adjacent support element is configured to independently move at least vertically and includes an upper surface. The apparatus further includes a thermal energy transfer device operably coupled to each of the mutually lateral support elements, and an actuator system operably coupled to each of the mutually lateral support elements to selectively move one or more of the support elements vertically.

According to another embodiment, a wafer support apparatus that includes a continuous flexible support layer. The continuous flexible support layer includes an upper surface to receive a bottom surface of a wafer and a group of adjacent temperature zones. The wafer support apparatus further includes an actuator system operably coupled to the continuous flexible support layer and configured to flex the upper surface of the continuous flexible support layer to conform to the bottom surface of the wafer, and a thermal energy transfer device operably coupled to the continuous flexible support layer and configured to independently transfer thermal energy to or from each of the temperature zones.

In yet another embodiment, a method includes receiving a surface profile data map of a bottom surface of a semiconductor wafer, and based at least in part on the surface profile data map, adjusting levels of upper surfaces of a group of support elements to cause the upper surfaces to approximate the surface profile of the bottom surface of the semiconductor wafer.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method comprising:
   receiving a surface profile data map of a bottom surface of a semiconductor wafer, the surface profile data map derived from one or more of two-dimensional measurement data and three-dimensional measurement data; and
   based, at least in part on the surface profile data map, selectively and independently adjusting levels of upper surfaces of a group of mutually lateral adjacent support elements using an actuator system operably coupled to each of the group of mutually lateral adjacent support elements to cause the upper surfaces of the group of mutually lateral adjacent support elements to approximate and conform to a surface profile of the bottom surface of the semiconductor wafer, the upper surfaces of the group of mutually lateral adjacent support elements allowed to pivot at a ball joint to maintain physical contact between the upper surfaces of the group of mutually lateral adjacent support elements and the bottom surface of the semiconductor wafer.

2. The method of claim 1, further comprising:
   maintaining physical contact of the upper surfaces of the group of mutually lateral adjacent support elements with the bottom surface of the semiconductor wafer.

3. The method of claim 1, wherein the receiving a surface profile data map of a bottom surface of a semiconductor wafer further comprises:
   receiving one or more of a bow measurement and a warp measurement of the semiconductor wafer.

4. The method of claim 1, wherein selectively and independently adjusting levels of upper surfaces of the group of mutually lateral adjacent support elements comprises:
   independently and vertically translating an upper surface of one or more support elements of the group of mutually lateral adjacent support elements.

5. The method of claim 4, wherein selectively and independently adjusting levels of upper surfaces of the group of mutually lateral adjacent support elements further comprises:
   conforming a continuous flexible structure, disposed over the group of mutually lateral adjacent support elements, to approximate the surface profile of the bottom surface of the semiconductor wafer.

6. The method of claim 1, further comprising:
   heating the semiconductor wafer by one or more heating devices operably coupled to the group of mutually lateral adjacent support elements.

7. The method of claim 1, further comprising:
   cooling the semiconductor wafer by one or more cooling devices operably coupled to the group of mutually lateral adjacent support elements.

8. The method of claim 1, further comprising allowing the upper surfaces of the group of mutually lateral adjacent support elements to turn at a flexible post to maintain physical contact between the upper surfaces of the group of mutually lateral adjacent support elements and the bottom surface of the semiconductor wafer.

9. The method of claim 1, wherein selectively and independently adjusting levels of upper surfaces of the group of mutually lateral adjacent support elements comprises using the actuator system to tilt one of the group of mutually lateral adjacent support elements by vertically translating a first edge of the one of the group of mutually lateral adjacent support elements by a first distance and vertically translating a second edge of the one of the group of mutually lateral adjacent support elements by a second distance greater than the second distance.

10. The method of claim 1, further comprising capturing an image of the semiconductor wafer and generating the surface profile data map based on the image.

11. The method of claim 1, further comprising individually and selectively transferring thermal energy to, or from, respective locations of the semiconductor wafer.

12. The method of claim 1, further comprising:
    transferring thermal energy to or from a first location of the semiconductor wafer at a first one of the group of mutually lateral adjacent support elements by heating, or cooling, the first one of the group of mutually lateral adjacent support elements; and
    independent of the heating, or cooling, of the first one of the group of mutually lateral adjacent support elements, transferring thermal energy to or from a second location of the semiconductor wafer at a second one of the group of mutually lateral adjacent support elements by heating, or cooling, the second one of the group of mutually lateral adjacent support elements.

13. A method comprising:
    receiving a surface profile data map of a bottom surface of a semiconductor wafer, the surface profile data map derived from one or more of two-dimensional measurement data and three-dimensional measurement data; and
    based, at least in part on the surface profile data map, conforming a continuous flexible structure, disposed over mutually lateral adjacent support elements to approximate a surface profile of the bottom surface of the semiconductor wafer by selectively and independently adjusting levels of upper surfaces of the mutually lateral adjacent support elements using an actuator system operably coupled to each of the mutually lateral adjacent support elements, the continuous flexible structure comprising:
      portions of heat transfer material vertically overlying and within lateral boundaries of upper surfaces of the mutually lateral adjacent support elements; and
      portions of thermal insulating material vertically overlying and laterally overlapping the upper surfaces of pairs of the mutually lateral adjacent support elements, the portions of thermal insulating material laterally alternating with the portions of heat transfer material.

14. The method of claim 13, wherein selectively and independently adjusting levels of upper surfaces of mutually lateral adjacent support elements comprises independently and vertically translating an upper surface of one or more support elements of the group of mutually lateral adjacent support elements.

15. The method of claim 13, further comprising individually and selectively transferring thermal energy to, or from, respective locations of the semiconductor wafer.

16. A method comprising:
receiving a surface profile data map of a bottom surface of a semiconductor wafer, the surface profile data map derived from one or more of two-dimensional measurement data and three-dimensional measurement data;
based, at least in part on the surface profile data map, conforming a continuous flexible structure to approximate a surface profile of the bottom surface of the semiconductor wafer by selectively and independently adjusting levels of upper surfaces of support elements underlying the continuous flexible structure using an actuator system underlying and operably coupled to each of the support elements, wherein:
the continuous flexible support structure comprises portions of heat transfer material and portions thermal insulating material laterally alternating with the portions of heat transfer material; and
the support elements are configured to vertically move independent of one another, lateral boundaries of at least some of the support elements overlapping lateral boundaries of the portions of heat transfer material of the continuous flexible support structure; and individually and selectively transferring thermal energy to, or from, respective locations of the semiconductor wafer using a thermal energy transfer device operably coupled to the portions of heat transfer material of the continuous flexible support structure.

17. The method of claim 16, wherein individually and selectively transferring thermal energy to, or from, the semiconductor wafer at the respective locations of the semiconductor wafer comprises heating, or cooling, the respective locations of the semiconductor wafer using respective heating devices, or cooling devices, operably coupled to respective ones of the mutually lateral adjacent support elements.

18. The method of claim 16, wherein selectively and independently adjusting levels of upper surfaces of the mutually lateral adjacent support elements comprises independently and vertically translating an upper surface of one or more support elements of the mutually lateral adjacent support elements.

19. The method of claim 16, wherein selectively and independently adjusting levels of upper surfaces of the mutually lateral adjacent support elements further comprises conforming a continuous flexible structure, disposed over the mutually lateral adjacent support elements, to approximate the surface profile of the bottom surface of the semiconductor wafer.

\* \* \* \* \*

UNITED STATES PATENT AND TRADEMARK OFFICE
CERTIFICATE OF CORRECTION

| | | Page 1 of 1 |
|---|---|---|
| PATENT NO. | : 12,183,621 B2 | |
| APPLICATION NO. | : 17/931444 | |
| DATED | : December 31, 2024 | |
| INVENTOR(S) | : Paul D. Shirley | |

It is certified that error appears in the above-identified patent and that said Letters Patent is hereby corrected as shown below:

In the Specification

Column 14, Lines 65-66, change "silicon-on-insulator ("SOT") substrates," to --silicon-on-insulator ("SOI") substrates,--

In the Claims

Claim 14, Column 17, Line 8, change "elements of the group of the mutually lateral" to --elements of the mutually lateral--

Signed and Sealed this
Twenty-fifth Day of February, 2025

Coke Morgan Stewart
*Acting Director of the United States Patent and Trademark Office*